(12) United States Patent
Daxer et al.

(10) Patent No.: US 7,795,909 B1
(45) Date of Patent: Sep. 14, 2010

(54) HIGH SPEED PROGRAMMING OF PROGRAMMABLE LOGIC DEVICES

(75) Inventors: Kenneth T. Daxer, Sunnyvale, CA (US); Adam J. Wright, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 154 days.

(21) Appl. No.: 12/103,567

(22) Filed: Apr. 15, 2008

(51) Int. Cl.
G06F 7/38 (2006.01)
H03K 19/177 (2006.01)

(52) U.S. Cl. .......................... 326/39; 716/16; 375/219; 375/220; 710/71

(58) Field of Classification Search ............. 326/37–41, 326/47; 716/16; 375/219, 220; 710/71; 713/375, 400, 500, 501
See application file for complete search history.

(56) References Cited

U.S. PATENT DOCUMENTS

| | | | |
|---|---|---|---|
| 5,748,559 A | 5/1998 | Raza et al. | |
| 6,650,140 B2 | 11/2003 | Lee et al. | |
| 6,724,328 B1 * | 4/2004 | Lui et al. | 341/101 |
| 6,831,480 B1 | 12/2004 | Shumarayev et al. | |
| 7,071,726 B1 * | 7/2006 | Chan et al. | 326/8 |
| 7,138,820 B2 * | 11/2006 | Goetting et al. | 326/9 |
| 7,242,218 B2 * | 7/2007 | Camarota et al. | 326/41 |
| 7,359,811 B1 * | 4/2008 | Liu | 702/69 |
| 7,505,331 B1 * | 3/2009 | Camarota | 365/189.08 |
| 7,548,091 B1 * | 6/2009 | Liu | 326/40 |
| 2001/0033188 A1 * | 10/2001 | Aung et al. | 327/141 |
| 2005/0270061 A1 * | 12/2005 | Otterstedt | 326/38 |

* cited by examiner

*Primary Examiner*—Vibol Tan
*Assistant Examiner*—Dylan White
(74) *Attorney, Agent, or Firm*—Treyz Law Group; David C. Kellogg

(57) ABSTRACT

A programmable logic device that receives and stores configuration data in configurable random-access-memory has differential signal input buffer circuitry for receiving the configuration data from a configuration device in differential signal form at high speeds. The programmable logic device may have clock and data recovery circuitry that receives a reference clock and that generates a corresponding internal clock that is used for receiving the configuration data. Error detection circuitry may be used to detect errors occurring during data transmission. The configuration device may have a serializer that serializes parallel configuration data received from memory and differential signal output driver circuitry that provides the configuration data in differential signal form to the programmable logic device.

16 Claims, 7 Drawing Sheets

HIGH SPEED PROGRAMMING OF PROGRAMMABLE LOGIC DEVICES

BACKGROUND

This invention relates to programming integrated circuits, and more particularly, to high speed loading of configuration data files to integrated circuits such as programmable logic devices.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data files. The configuration data is loaded into memory elements on the programmable logic devices to configure the devices to perform the desired custom logic function.

Programmable logic device memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable logic device, loaded CRAM cells produce static output signals that are applied to the gates of metal-oxide-semiconductor (MOS) field-effect transistors (e.g., pass transistors). The CRAM output signals turn some transistors on and turn other transistors off. This selective activation of certain transistors on the device customizes the operation of the device so that the device performs its intended function.

Prior to use, programmable logic devices are generally tested. During testing, programmable logic resources and interconnects are checked for defects. Such testing takes time and is normally performed by specialized equipment at the programmable logic device manufacturer. If a defect is found, the programmable logic device may be repaired or discarded as appropriate.

Thorough testing of resources on a programmable logic device can be time-consuming. The testing process involves repeated loading of test configuration data files into the programmable logic device to be tested. Each resulting logic configuration may then be tested.

In a typical programmable logic device testing scenario, each test configuration data file may include millions of bits of programming data. Because hundreds of programmable logic device configurations may need to be tested, large quantities of programming data must be loaded into the programmable logic device over the course of the testing procedure.

Loading of configuration data is also required during the normal operation of the device by the end user. It is desirable that the loading time of the configuration data be as short as possible for quick system bring-up.

Existing systems for loading configuration data into programmable logic devices either load the data in a serial single-ended-signal fashion, which tends to be slow, or in a parallel fashion, which may consume an undesirable number of input-output pins.

It would therefore be desirable to provide a system and a method for loading integrated circuits, such as programmable logic devices, in a high speed manner while maintaining minimal integrated circuit pin consumption.

SUMMARY

In accordance with the present invention, integrated circuits are provided with capabilities for supporting the loading of programming data at high speeds without using parallel data paths. A programmable logic device in accordance with the invention may receive and store configuration data in configuration random-access-memory. The programmable logic device may have differential signal input buffer circuitry for receiving configuration data in differential signal form at high speeds. The device may have clock and data recovery circuitry that receives a reference clock and generates a higher speed internal clock that is used for receiving the configuration data. Error detection circuitry may be used to detect errors occurring during data transmission. Data may be retransmitted if an error is detected.

The system may have a host circuit. The host circuit may be connected to a memory that is used to store the configuration data prior to loading the configuration data onto the programmable logic device for testing. The host may have a differential output driver that transmits the configuration data to the programmable logic device in differential signal form. The host may also have a serializer that serializes the configuration data received from the memory before transmission by the differential output driver to the programmable logic device.

By using a differential signaling arrangement to convey configuration data to the programmable logic device, configuration data may be conveyed at high speeds without requiring use of an undesirably large number of input/output pins on the programmable logic device.

Further features of the invention, its nature and various advantages will be more apparent from the accompanying drawings and the following detailed description of the preferred embodiments.

DETAILED DESCRIPTION

The present invention relates to the loading of configuration data into integrated circuits containing memory elements. The memory elements may be volatile memory elements such as random-access-memory cells. The integrated circuits may be memory chips, digital signal processing circuits, microprocessors, application specific integrated circuits, programmable logic device integrated circuits, or any other suitable integrated circuit. The present invention will generally be described in the context of programmable logic device integrated circuits and programmable logic device memory elements that are loaded with configuration data as an example.

Figure 1:
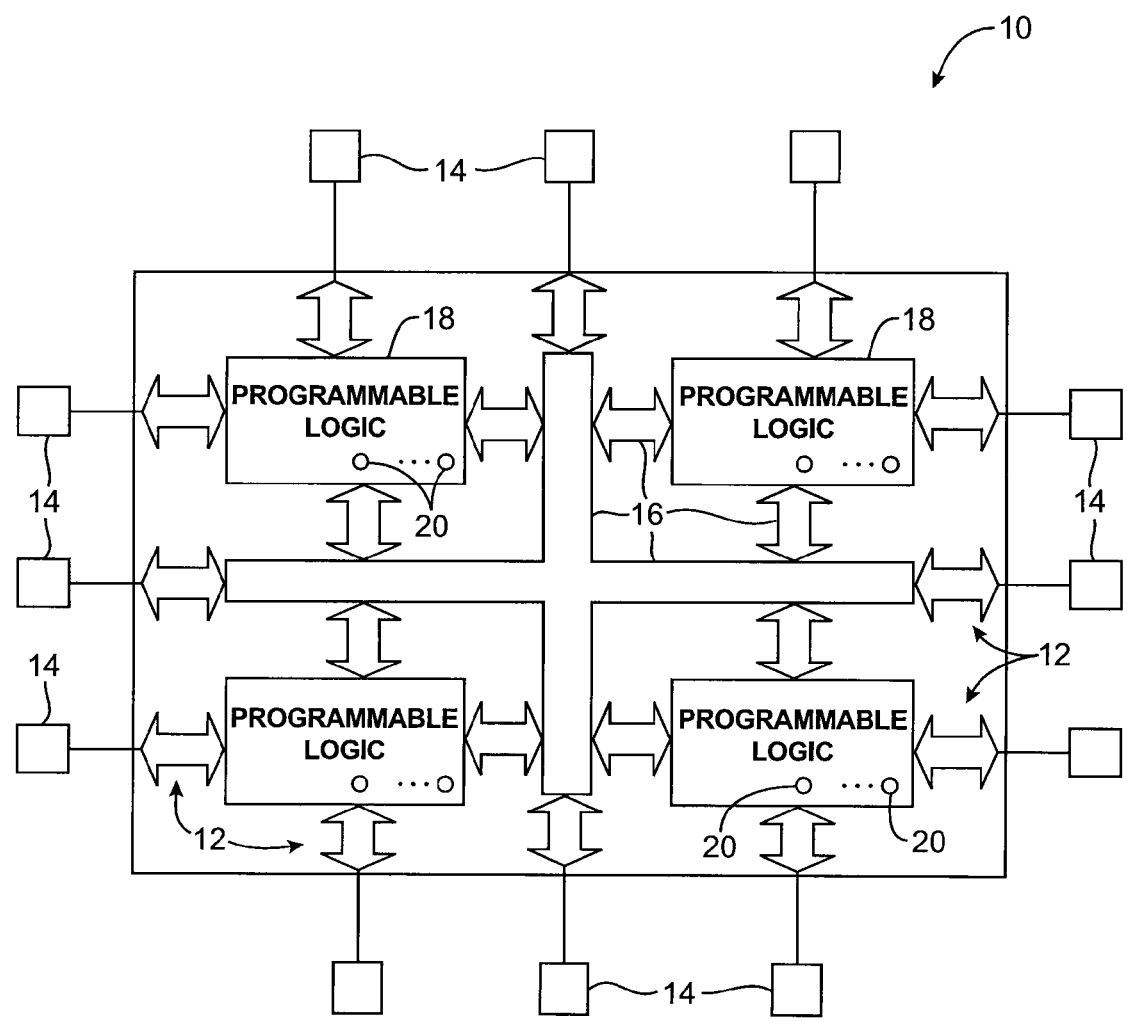
FIG. 1 is a diagram of an illustrative programmable logic device in accordance with an embodiment of the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 may contain volatile memory elements 20 that can be loaded with configuration data (also called programming data) using pins 14 and input/output circuitry 12. Once loaded, the memory elements may each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers and logic array blocks (LABs) and p-channel metal-oxide-semiconductor (PMOS) transistors.

When a memory element supplies a high output to an NMOS pass transistor, the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design. Programmable PMOS transistors may be used as power-down transistors (as an example).

A typical memory element 20 is formed from a number of transistors configured to form cross-coupled inverters. With one suitable approach, complementary metal-oxide-semiconductor (CMOS) integrated circuit technology is used to form the memory elements 20. In the context of programmable logic device integrated circuits, the memory elements store configuration data and are typically random-access-memory (RAM) elements. As a result, these programmable logic device memory elements are sometimes referred to as configuration random-access-memory (CRAM) cells. Other terms that are sometimes used to refer to memory elements 20 include terms such as memory cells, static random-access-memory elements or cells, RAM cells, RAM elements, CRAM cells, configuration elements, volatile memory elements, configuration bits, etc. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
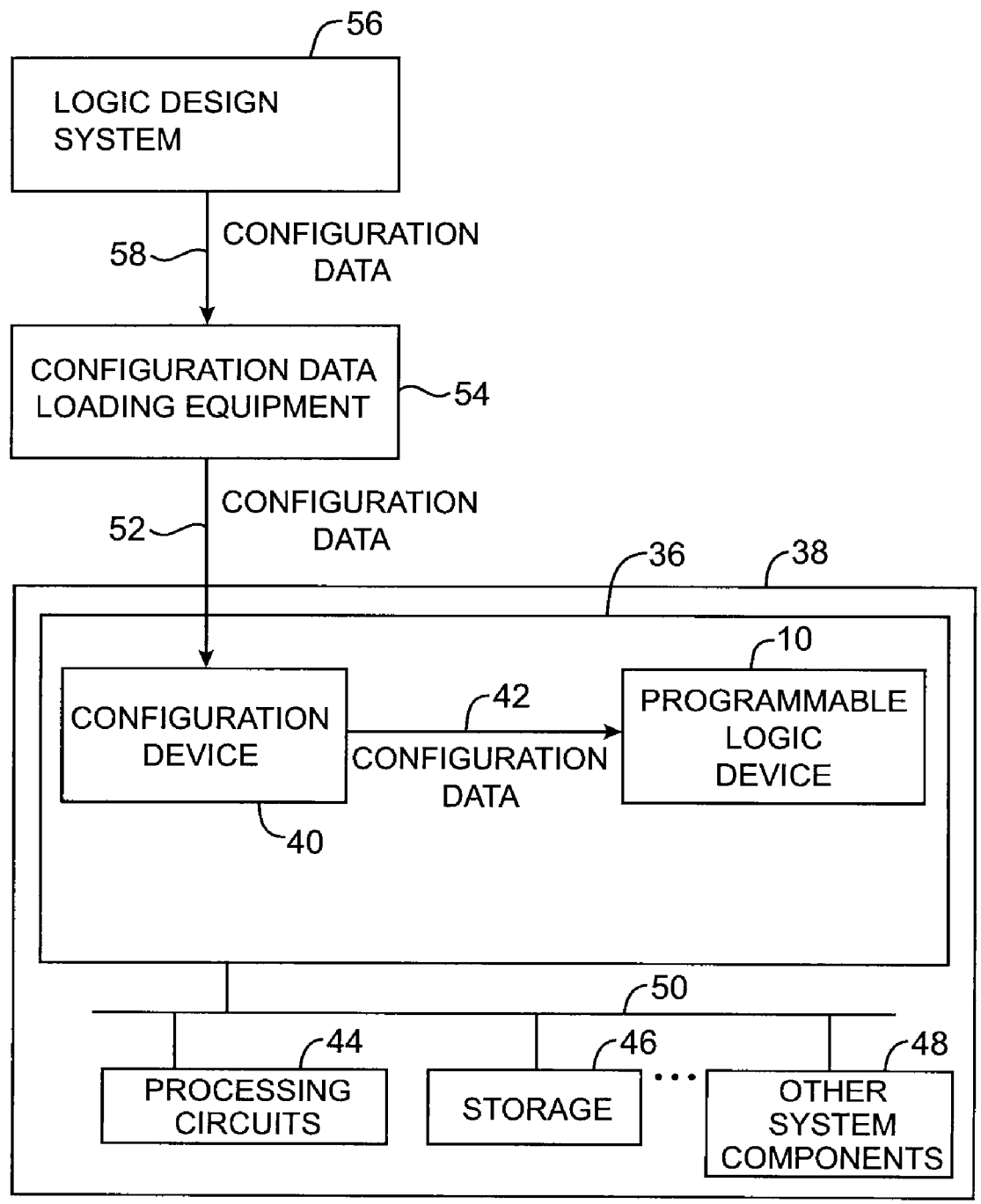
FIG. 2 is a diagram showing how programmable logic device configuration data is created by a logic design system and loaded into a programmable logic device to configure the device for operation in a system in accordance with an embodiment of the present invention.

An illustrative system environment for configuring (programming) a programmable logic device 10 is shown in FIG. 2. Programmable logic device 10 may be mounted on a board 36 in a system 38. In general, programmable logic device 10 may receive programming data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), a host device that loads configuration data into device 10 from an associated memory chip, or any other suitable device. When system 38 boots up (or at another suitable time), the configuration data for configuring the programmable logic device may be supplied to the programmable logic device by device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 (or an associated memory circuit) may be supplied with the configuration data for device 10 over a path such as path 52. Configuration device 40 may, for example, receive the configuration data from configuration data loading equipment 54 or other suitable equipment that stores this data in configuration device 40.

As shown in FIG. 2, the configuration data produced by a logic design system 56 may be provided to equipment 54 over a path such as path 58. The equipment 54 may provide the configuration data to device 40, so that device 40 can later provide this configuration data to the programmable logic device 10 over path 42.

To guarantee quality and performance of the integrated circuit, such as a programmable logic integrated circuit, a number of test procedures are generally performed before a programmable device is programmed for a specific application function. For memory-based programmable logic devices, these tests may include memory cell current reading tests, checker board tests, address decode tests, and logic function tests.

A logic function test typically involves programming a device to perform the functions of various logic circuits, such as inverters, counters, or other logic circuits. This facilitates functional testing of the device. If desired, registers may be preloaded, making it unnecessary to cycle through long test vector sequences to reach a desired state.

The testing of programmable logic devices may require upwards of 300 different programming (loading) and erasing operations. The speed at which the loading operation for each configuration data set occurs greatly impacts the overall testing time for each programmable logic device.

Further, in an end user environment, it is required that the overall system bring-up time be minimized. The loading operation (or configuration) of a programmable logic device or programmable logic devices utilized in the end user's system consumes a portion or portions of the bring-up time. End customers may require that the specification for a programmable logic device have a maximum configuration time or may select a particular programmable logic device based upon, at least in part, its short configuration time.

Therefore, it is desirable to have the loading operation (or configuration) of a programmable logic device to be minimized as much as possible.

Figure 3:
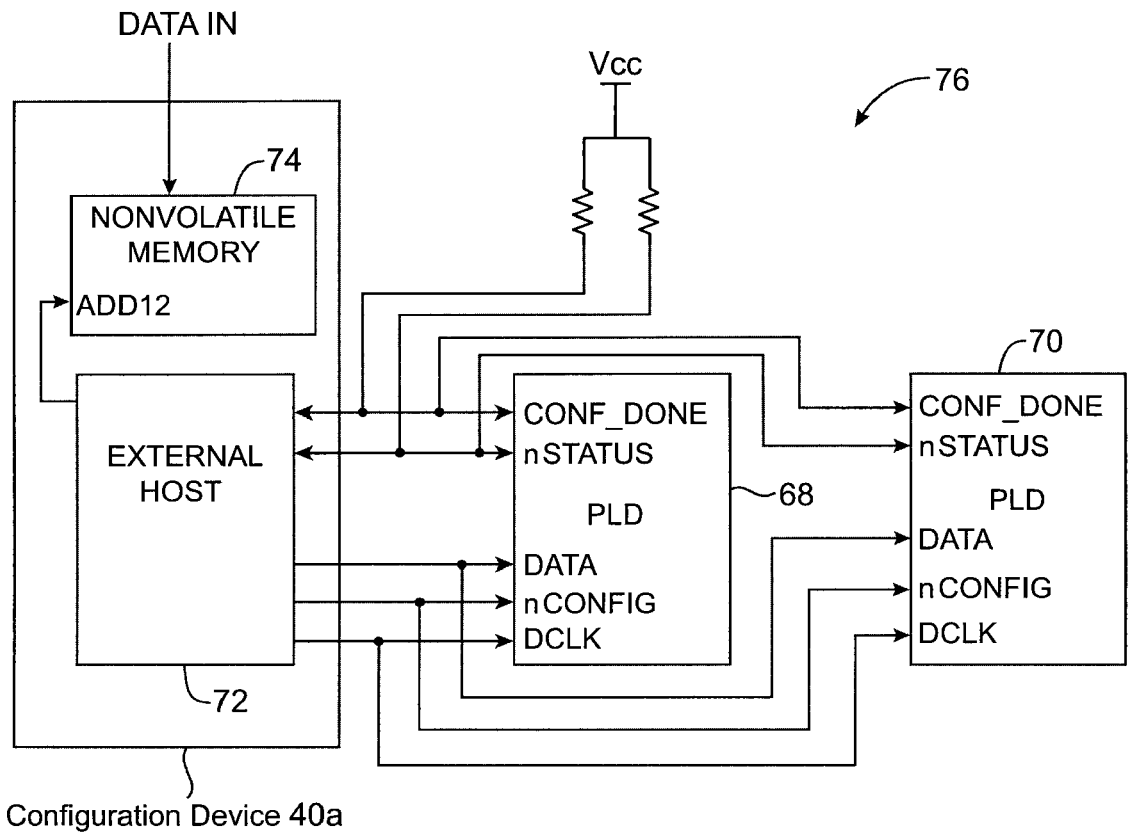
FIG. 3 is a diagram of a conventional programmable logic device programming system having a single-ended serial data input for receiving configuration data.

A conventional system 76 having a configuration device 40*a* used for configuring an integrated circuit such as PLD 68 is shown in FIG. 3. Numerous programmable logic devices (e.g., PLD 68, PLD 70) can be configured concurrently. Two programmable logic devices, PLD 68 and PLD 70 are shown in FIG. 3, but additional programmable logic devices may be likewise arranged and configured. Configuration device 40*a* has an external host 72 for supporting processing functions and a memory 74 for storing the configuration data. Host 72 and memory 74 may be portrayed together as a single device.

Configuration device 40*a* provides configuration data via a data path to the DATA port of each programmable logic device (PLD 68, PLD 70). The data path is a single-ended data path that is a single bit wide so that configuration data is provided to the programmable logic devices in a serial bit-by-bit fashion. Configuration device 40*a* further provides a clock to the DCLK port of each programmable logic device for clocking in the configuration data received from configuration device 40*a*. A standard maximum clock frequency for a serial data input arrangement of the type shown in FIG. 3 is 100 MHz. When the loading of configuration data from the configuration device 40*a* to the programmable logic device is ready to commence, the configuration device 40*a* asserts (or, in this case, brings to a low voltage such as 0 volts) the nCONFIG signal to indicate to the programmable logic device(s) that configuration data will be forthcoming.

Programmable logic device(s) may utilize an nSTATUS line to indicate to the configuration device 40*a* that an error in loading has occurred and the configuration device 40*a* should restart the loading process. Programmable logic device(s) may utilize a CONF_DONE line to indicate to the configuration device 40*a* that the loading of the configuration data has been successfully completed.

Using this type of conventional programming system, configuration device 40*a* loading of 30,500,000 configuration bits at the maximum frequency of 100 MHz with the 1-bit data bus would require 305 milliseconds. The minimum test time for a test flow with 300 configurations would therefore be 91.5 seconds. This is a substantial amount of time given the large number of programmable logic devices typically to be tested.

Figure 4:
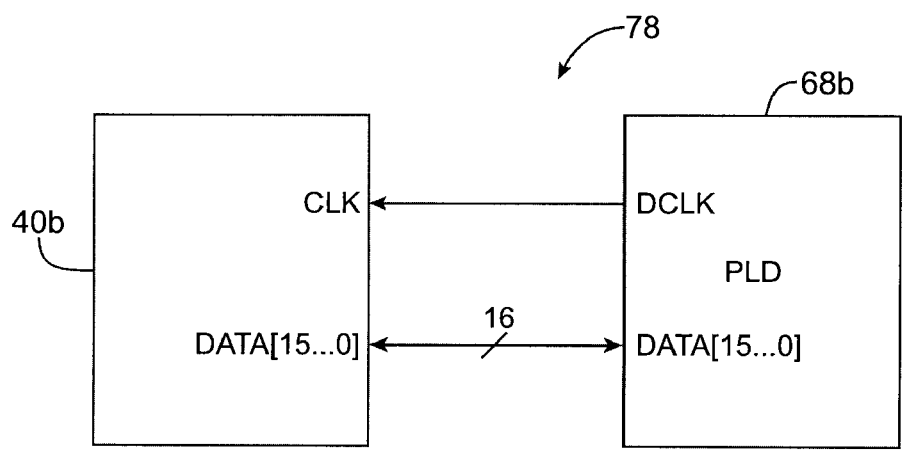
FIG. 4 is a diagram of a conventional programmable logic device programming system having a parallel data input for receiving configuration data.

Another conventional programming system is shown in FIG. 4. Programming system 78 of FIG. 4 has a configuration device 40*b* for configuring PLD 68*b*. Configuration device 40*b* has a 16-bit wide parallel data bus for conveying configuration data to PLD 68*b*. This configuration data is clocked into PLD 68*b* by a DCLK clock signal. In this example, PLD 68*b* is driving the loading operation by providing the DCLK signal to the configuration device 40*b*. Use of the parallel configuration data loading arrangement of FIG. 4 (16 bits wide) allows PLD 68*b* to be loaded more rapidly than with comparable single-ended, single-bit data loading arrangements. For example, a programmable logic device can be loaded with 30,500,000 configuration bits at a clock frequency of 100 MHz with a 16-bit data bus in 19 milliseconds. The minimum test time for a test flow of 300 configurations in this scenario would be 5.7 seconds. This is less than the 91.5 seconds that would be required using the serial loading arrangement of FIG. 3.

However, the design of a parallel data loading system consumes a large number of pins. For example, 15 more pins are required in a conventional 16-bit parallel bus system than in a conventional serial bus system. In IC design, it is desirable to minimize the required number of pins by, for example, providing more functions using the same number of pins, or by providing the same functions using fewer pins. Using fewer pins has the advantage of reducing the size of the chip and the expense of packaging the chip. For example, a design that uses only six pins to perform a certain function is superior in this respect to a design that requires eight pins to perform the same function.

Moreover, in conventional integrated circuit design, certain input pins may only be used to configure the chip during initialization of the chip, such as at start up, or during the testing of the chip. Once the chip is configured, these input pins may not be available for any other purpose or would be available only by use of complex pin sharing circuitry. The use of many parallel pins to increase configuration data loading throughput may therefore increase chip size and complexity.

The present invention overcomes the limitations of conventional configuration loading arrangements. In particular, the invention may overcome problems associated with low loading speeds and excessive pin consumption by providing configuration data to an integrated circuit such as a programmable logic device from a configuration device via a high speed serial differential data path. The differential data path may have two differential signal lines. An independent high speed reference clock (i.e., a clock not phase locked, but frequency locked, with the data input) may be used. The differential path may carry high speed differential signals (i.e., signals whose voltages are referenced to each other, rather than to ground).

Figure 5:
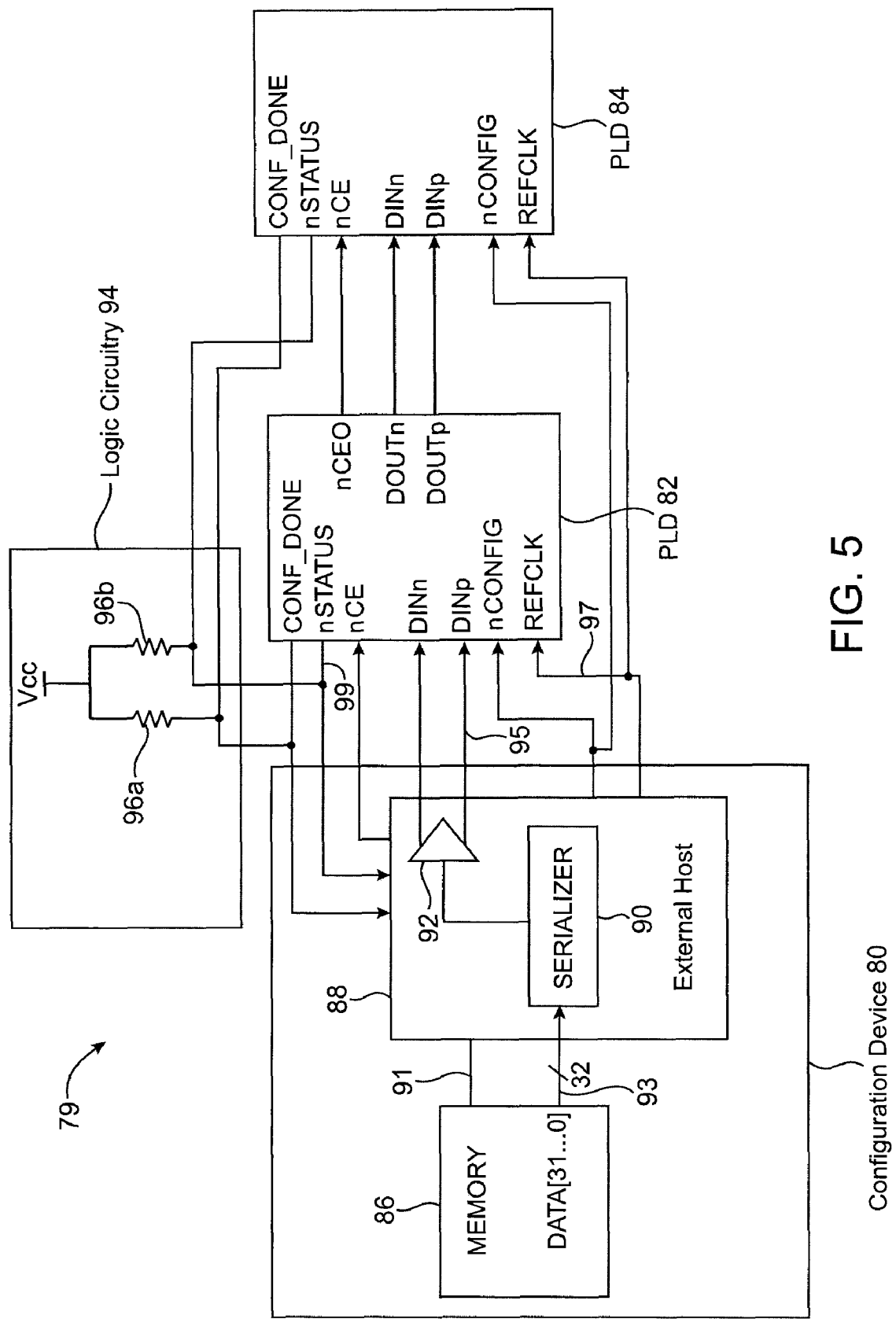
FIG. 5 is a diagram of a programmable logic device programming system that retrieves configuration data from memory and conveys the configuration data in differential form to a programmable logic device.

FIG. 5 illustrates an embodiment of a system 79 of the present invention. System 79 may include a configuration device 80 for configuring one or more integrated circuits (e.g., PLD 82, PLD 84) and may include logic circuitry 94. In this type of arrangement, PLD 82 and PLD 84 may be loaded with configuration data in a serial or daisy chain fashion. While only two programmable logic devices (PLD 82, PLD 84) are shown, any number of additional programmable logic devices may be configured using this type of system.

Configuration device 80 may include memory 86 for storing configuration data. The configuration data may be provided as one or more sets of data and may be created and received from logic design system 56 and configuration data loading equipment 54 as described in connection with FIG. 2. Memory 86 may be any type of non-volatile memory (i.e., memory that can retain stored information even when not powered). For example, memory 86 may be electronically programmable read-only memory (EPROM), erasable electrically programmable read-only memory (EEPROM), flash read-only memory, etc. An advantage of flash memory devices is that they are easily electrically erased and reprogrammed at high speed.

Configuration device 80 may include an external host unit 88 connected to memory 86. Host unit 88 may be an integrated circuit that provides processing functions for configuration device 80. External host unit 88 may have a serializer 90 connected to a single-ended-to-differential output driver 92. Output driver 92 may receive a single-ended input and may produce a differential signal output. Host 88 and memory 86 of configuration device 80 can be integrated on a single die, can be fabricated in a single package or can be provided as separate chips.

External host unit 88 may be connected to memory 86 via a 32-bit-wide data path 93. This data path may be used to receive configuration data previously stored in memory 86. Data from memory 86 can be conveyed to external host unit 88 over a 32-bit-wide parallel bus of this type or over any other suitable communications path. Parallel communication may be preferred for this link because it allows several configuration data signals to be conveyed in parallel thereby enhancing throughput. Serial communications arrangements, in which data is transferred one bit at a time, may also be used for the link between memory 86 and host 88. In a typical parallel bus arrangement, external host unit 88 may provide addressing information for the data to memory 86 via a memory address path 91. As the memory is addressed over path 91, the addressed configuration data is passed to the external host unit 88 via data path 93.

External host 88 may receive configuration data in a 32-bit wide parallel stream over path 93 and may serialize this configuration data in real time using serializer 90. Serializer 90 receives configuration data in parallel form at its input and produces a serial bit stream of the configuration data at its output. The serial bit stream is passed to the input of single-ended-to-differential output driver 92. Driver 92 may convert the single-ended serial bit stream to a differential signal output pair. Differential signaling is a method of transmitting information electrically by means of two signals that are referenced to each other. Differential signaling schemes use two-wire buses such as path 95 of FIG. 5.

The configuration data previously stored in memory 86 may have been encoded using a suitable encoding scheme such as 8b/10b encoding or, alternatively, serializer 90 may have an 8b/10b encoder therein to encode the data as it is being serialized. The 8b/10b format is based on a code that maps 8-bit symbols to 10-bit symbols to achieve DC-balance and provide a sufficient number of state changes to ensure satisfactory clock recovery. With 8b/10b encoding, the difference between the count of 1s and 0s in a configuration data string of at least 20 bits will be no more than two, and that there will be no more than five is or 0s in a row. This helps to reduce the demand for bandwidth over path 95.

Configuration device 80 provides configuration data via differential signal data path 95 to the DINn and DINp input terminals of PLD 82 so that the configuration data may be stored in PLD 82. If desired, one or more programmable logic devices such as PLD 84 may be connected in a chain by connecting each programmable logic device's configuration data input terminals (DINn and DINp) to the configuration data output terminals (DOUTn and DOUTp) of a preceding programmable logic device in the chain.

Differential data path 95 has a pair of signal lines but is a single bit wide, so that configuration data is provided to PLD 82 in a serial bit-by-bit fashion. Clock path 97 may be used by configuration device 80 to provide a reference clock REFCLK to the REFCLK port of each programmable logic device. For example, PLD 82 may use the REFCLK clock signal for clocking in the configuration data received from configuration device 80 over path 95.

Any suitable clock frequency may be used for signal REFCLK. For example, the memory address signals supplied by host 88 to memory 86 over path 91 may have a clock frequency of 100 MHz leading to a configuration data stream over path 93 at 3200 Mbps. To maintain this transfer rate of data flow between host 88 and PLD 82, clock signal REFCLK may be provided at 100 MHz (as an example) and may be used to internally generate a 3200 MHz internal clock in PLD 82.

When the loading of configuration data from the configuration device 80 to the programmable logic device is ready to commence, the configuration device 80 asserts (e.g., brings to a low voltage such as 0 volts) the nCONFIG signal to indicate to the programmable logic device that configuration data will be forthcoming.

PLD 82 may utilize an nSTATUS line to indicate to the configuration device 80 that an error in loading has occurred. When configuration device 80 is alerted of an error, configuration device 80 may restart the loading process or take other suitable action. The nSTATUS output may be connected to both external host 88 and to logic circuitry 94 (e.g., resistor 96b). Logic circuitry 94 keeps the nSTATUS signal pulled high until PLD 82 drives the nSTATUS signal to a low voltage such as zero volts.

PLD 82 may utilize a CONF_DONE line to indicate to the configuration device 80 that the loading of the configuration data has been successfully completed. The CONF_DONE output may be connected to external host 88 and to logic circuitry 94 (resistor 96a) for maintaining the CONF_DONE signal at a high level (e.g., $V_{CC}$) until it is pulled low by PLD 82.

PLD 82 further may have a chip enable port for receiving a chip enable signal nCE from configuration device 80. The configuration device 80 may assert (e.g., brings to a low voltage such as 0 volts) the nCE signal to enable PLD 82.

Configuration device 80 provides configuration data to PLD 82 via differential signal data path 95. The differential configuration data is received at the DINn and DINp inputs of PLD 82 so that the configuration data may be stored in PLD 82. Differential data signals may be provided at a very high speed (e.g., 3200 Mbps). This is significantly faster than the data rates achieved with conventional single-ended serial configuration data input systems. Systems of the type shown in FIG. 5 therefore allow for very short configuration data load times, thereby dramatically shortening the configuration processes (e.g., for testing).

In single-ended signaling schemes, a transmitter generates a single voltage that the receiver compares to ground. High voltage levels may be used to provide single-ended signals with some immunity from noise. Single-ended schemes have the advantage of requiring only one wire per signal. However, they also have a disadvantage because they generally cannot run at high speeds. The effects of capacitance and inductance, which filter out high-frequency signals, limit the speed at which reliable data transfer can occur over a single-ended line. Large voltage swings can also require significant power from the transmitting end. This problem can be reduced by using smaller voltages, but then the chance of mistaking random environmental noise for a signal becomes much more of a problem. Another difficulty is the electromagnetic interference that can be generated by a single-ended signaling system which attempts to operate at high speed.

Figure 6:
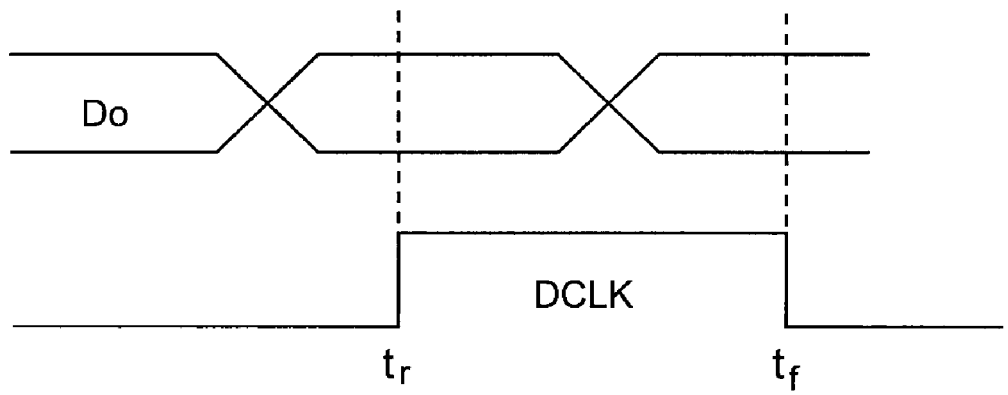
FIG. 6 is a chart illustrating the timing of the data and the data clock received by a programmable logic device in a conventional programming system.

In the conventional single-ended configuration data loading system discussed in connection with FIG. 3, the data clock DCLK is received at PLD 68 from configuration device 40a for clocking in single-ended data received at the DATA port. FIG. 6 is a timing diagram that shows the signals DATA and DCLK in a conventional system of the type described in connection with FIG. 3. As shown in FIG. 6, configuration data signal DATA is maintained in phase lock with the clock signal DCLK, so that the DATA signal has a fixed relation to the phase of the DCLK signal. In the figure, DATA, represented by D0, has a fixed relationship to the rising edge of DCLK at time $t_r$ and the falling edge of DCLK at time $t_f$. This fixed relationship causes the rising edge of DCLK to fall in the middle of the D0 configuration data signal, ensuring proper data reception by the programmable logic device during data loading operations.

Figure 7:
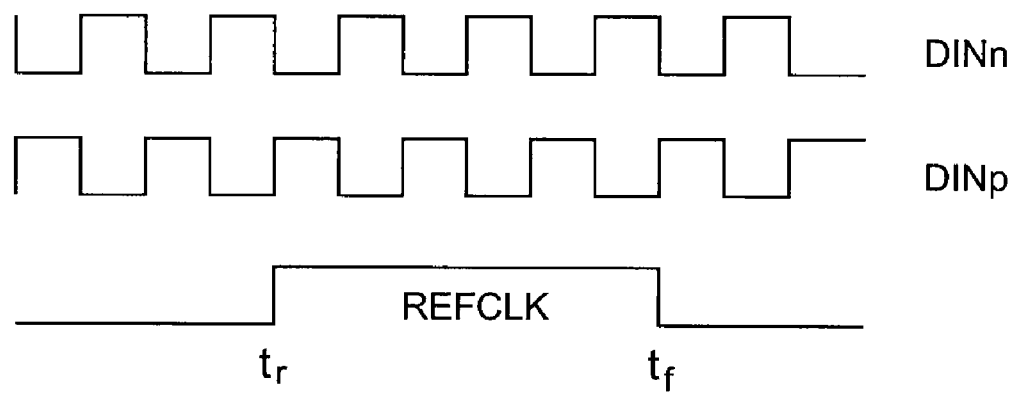
FIG. 7 is a chart illustrating the timing of the data and the reference clock received by a programmable logic device during programming in accordance with an embodiment of the present invention.

By contrast, as shown in FIG. 7, differential signal lines DINn, DINp, which are operating at a frequency (e.g., 3200 Mbps) much higher than the REFCLK frequency (100 MHz), are not phase locked to REFCLK so that DINn, DINp may have no fixed relation to the phase of REFCLK. (The frequency at which differential signals DINn, DINp are received may be referred to as received data speed, received data rate or simply data speed.) The data rate of DINn, DINp is, however, frequency locked with the REFCLK rate. To properly receive the differential configuration data signal, clock and data recovery circuitry may be used in PLD 82 to generate an internal clock at a rate appropriate for clocking in the differential data.

Figure 8:
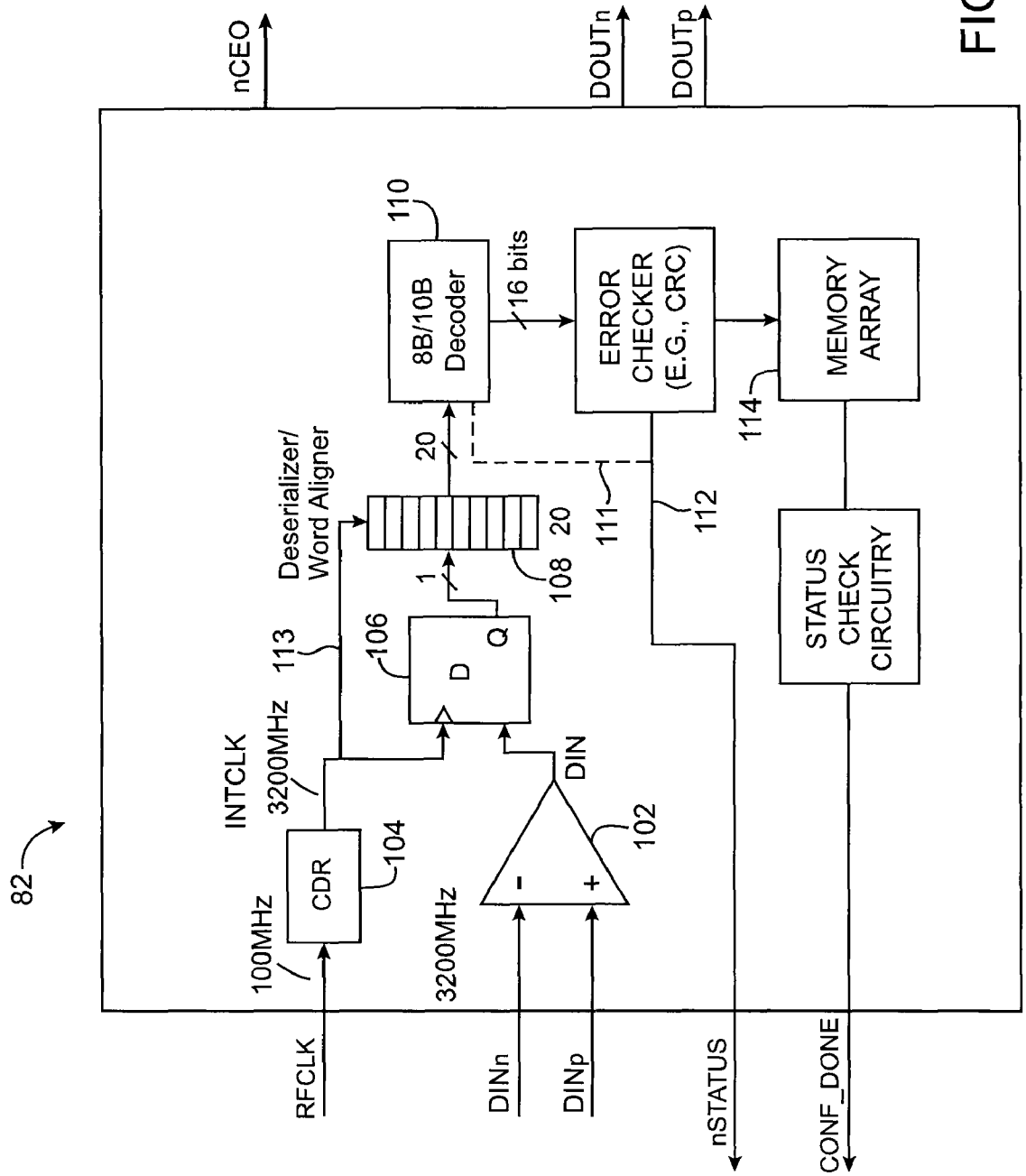
FIG. 8 is a diagram of a programmable logic device that receives configuration data in differential signal form, converts it to a suitable form in accordance with an embodiment of the present invention.

FIG. 8 illustrates in greater detail an embodiment of an integrated circuit, such as a programmable logic device 82, of the present invention. PLD 82 has a differential-to-single-ended input buffer 102 for receiving differential signals DINn and DINp and converting this differential data to a single-ended signal, DIN. PLD 82 may have a clock and data recovery (CDR) circuit 104 which recovers the clock and data from the serial data stream. Clock and data recovery circuit 104 may generate a higher speed clock INTCLK from a reference clock signal REFCLK using a phase-locked loop circuit. In the present example, INTCLK has a rate of 3200 MHz— identical to the received data rate. DIN and INTCLK are provided as inputs to latch 106 whose output is a single-bit wide data stream for input to a deserializer/word aligner 108. Deserializer/word aligner 108 receives internal clock signal INTCLK on path 113 and uses internal clock signal INTCLK to deserialize the single-bit wide data stream. Deserializer/word aligner 108 may create a corresponding 20-bit wide data stream operating at 160 MHz at its output (as an example). The deserializer/word aligner 108 aligns the data so that the start and end of a data word are properly aligned. Any suitable word size may be used in PLD 82. In the present example, the word size is 20 bits in 8b/10b encoded form or 16 bits decoded.

The 20-bit wide data stream from deserializer/word aligner circuit 108 is provided as input to an 8b/10b decoder 110 to decode the data stream from 10-bit symbols to 8-bit symbols thereby generating an output of 16 bits wide.

This output is provided to error checker circuitry 112. Circuitry 112 may be used to verify the integrity of received configuration data before the configuration data is loaded into configuration memory array 114. Any suitable error detection scheme may be used by error detection circuitry 112. For example, error detection circuitry 112 may use cyclic redundancy check (CRC) arrangements, checksum and parity and repetition schemes, etc. If an error is detected by circuitry 112, PLD 82 may assert the nSTATUS signal (i.e., the nSTATUS signal may be taken to a low voltage such as 0 volts) to indicate to configuration device 80 that an error has occurred during the data loading process and the loading process should be restarted. If an error is detected earlier in the circuitry, such as in the 8b/10b decode circuitry, the nSTATUS line can be asserted at that time (as denoted by dashed line 111).

Figure 9:
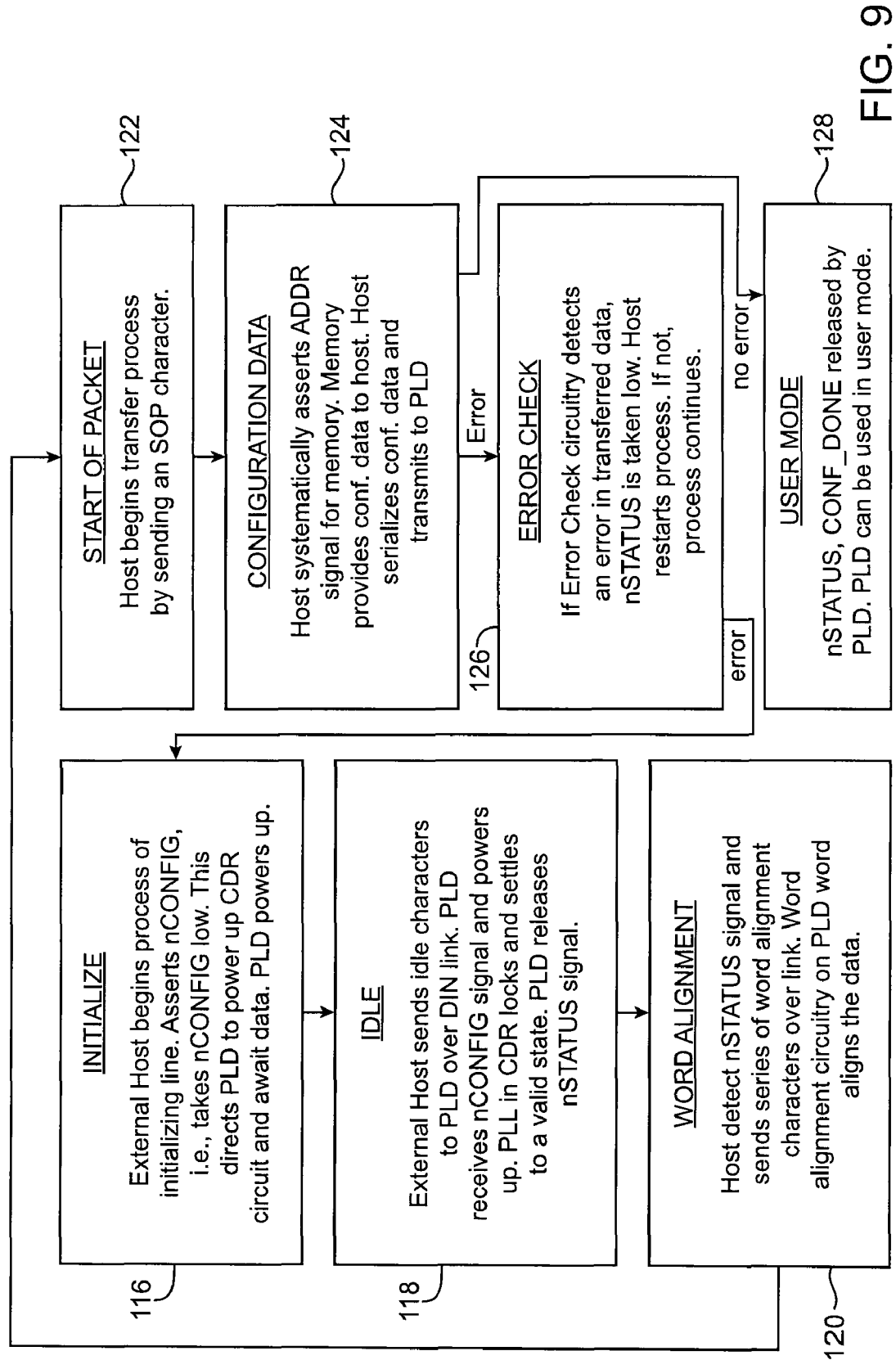
FIG. 9 is a flow chart of illustrative steps involved in loading configuration data from a configuration device into a programmable logic device in accordance with an embodiment of the present invention.

Illustrative steps involved in loading configuration data into an integrated circuit, such as a programmable logic device, using a differential signaling arrangement are shown in FIG. 9. At step 116, external host 88 begins the process of initializing the differential communication link between configuration device 80 and PLD 82 by asserting nCE and nCONFIG, i.e., by taking nCE low and pulsing nCONFIG low. This directs PLD 82 to power up CDR circuit 104 and to await data. PLD 82 powers up during step 116.

At step 118, external host 88 conveys idle characters to the PLD 82 over the DINn, DINp link and the PLL in the CDR 104 locks and settles to a valid state. PLD 82 then releases the nSTATUS signal, i.e., allowing the nSTATUS signal to be pulled high.

At step 120, external host 88 detects the high nSTATUS signal and sends a series of word alignment characters over the link in response. The word alignment circuitry 108 on the PLD 82 word aligns the data.

At step 122, the external host 88 begins the configuration data transfer process by sending a start of packet (SOP) character.

At step 124, the external host 88 systematically asserts the ADDR signal on path 91 for memory 86. In response, memory 86 provides configuration data to host 88 over parallel path 93. Host 88 serializes the configuration data using serializer 90, converts the serialized single-ended data to a differential signal form using single-ended-to-differential output driver 92 and transmits the serialized configuration data to PLD 82 over path 95.

As described in connection with FIG. 8, PLD 82 converts the data to a single-ended form, and deserializes, aligns, decodes the data and stores the data in CRAM memory cell array 114. If an error occurs during any of these steps, error check circuitry 112 or other suitable circuitry may detect the error. Accordingly, the nSTATUS signal may be taken low (step 126). Host 88 may then restart the configuration data loading process.

If there is no error in the transferred data, at step 128, the nSTATUS and CONF_DONE signals are released by PLD 82 and pulled high by logic circuitry 94. PLD 82 can be used in user mode. To test PLD 82, multiple sets of test configuration data may be loaded into PLD 82 over differential path 95 and associated test vectors may be applied to PLD 82. During testing, test configuration data may be supplied by a tester. If desired, the differential configuration data loading arrangement can be used to increase the speed of data loading in the field (i.e., when device 82 is mounted on a board in a system).

The foregoing is merely illustrative of the principles of this invention and various modifications can be made by those skilled in the art without departing from the scope and spirit of the invention.

What is claimed is:

1. A programmable logic device comprising:
a plurality of configuration random-access-memory cells;
differential signal input buffer circuitry that receives configuration data that is stored in the configuration random-access-memory cells, wherein the configuration data is received by the differential signal input buffer circuitry at a data speed; and
a circuit that receives a reference clock having a first clock speed and that generates an internal clock having a second clock speed, the second clock speed being faster than the first clock speed and being the same as the data speed, the internal clock being used for receiving the configuration data.

2. The programmable logic device defined in claim 1 wherein the configuration data comprises configuration words, the programmable logic device further comprising a word aligner that aligns the configuration data words using the internal clock.

3. The programmable logic device defined in claim 1 further comprising error checking circuitry that detects errors in the received configuration data and that generates a status signal when an error is detected.

4. The programmable logic device defined in claim 1 further comprising programmable logic wherein each configuration random-access-memory cell supplies a static output signal to the programmable logic based on its loaded configuration data.

5. Circuitry comprising:
a host integrated circuit having a differential signal output driver that sends configuration data in differential signal form to a programmable logic device for programming the programmable logic device, wherein the host integrated circuit has a serializer that receives a parallel input data stream of the configuration data and provides a serial output data stream of the configuration data to the differential signal output driver.

6. The circuitry defined in claim 5 further comprising a plurality of configuration random-access-memory cells and differential signal input buffer circuitry on the programmable logic device, wherein the differential signal input buffer circuitry receives the configuration data from the host integrated circuit and stores the received configuration data in the configuration random-access-memory cells.

7. Circuitry comprising:
a host integrated circuit having a differential signal output driver that sends configuration data in differential signal form to a programmable logic device for programming the programmable logic device; and
memory in which the configuration data is stored, wherein the host integrated circuit addresses the configuration data in the memory and receives a parallel input data stream in response and wherein the host integrated circuit provides the configuration data to the differential signal output driver in serial form.

8. Circuitry comprising:
a host integrated circuit having a differential signal output driver that sends configuration data in differential signal form to a programmable logic device for programming the programmable logic device; and
a plurality of configuration random-access-memory cells and differential signal input buffer circuitry on the programmable logic device, wherein:
the differential signal input buffer circuitry receives the configuration data from the host integrated circuit and stores the received configuration data in the configuration random-access-memory cells;
the configuration data in differential signal form has a data speed;
the host integrated circuit provides a reference clock having a first clock speed to the programmable logic device; and
the programmable logic device comprises a clock and data recovery circuit that receives the reference clock and that generates a corresponding internal clock having a second clock speed, the second clock speed being faster than the first clock speed and being the same as the data speed, the internal clock being used for receiving the configuration data.

9. The circuitry defined in claim 8 wherein the programmable logic device further comprises error checking circuitry that detects errors in the received configuration data and that generates a status signal when an error is detected.

10. A method for loading configuration data into a programmable logic device having a plurality of configuration random-access-memory cells, the method comprising:
providing, from a host integrated circuit, a reference clock;
receiving the reference clock at the programmable logic device;
generating an internal clock from the reference clock;
using a memory address path to obtain configuration data at the host integrated circuit from a memory;
providing, from the host integrated circuit, the configuration data in differential signal form to the programmable logic device;
receiving the configuration data in differential signal form at the programmable logic device using the internal clock;
converting the configuration data from differential signal form to single-ended signal form; and
storing the configuration data in the plurality of configuration random-access-memory cells.

11. The method defined in claim 10 further comprising checking the received configuration data for errors.

12. The method defined in claim 10 further comprising deserializing the received configuration data that is in single-ended form and word aligning the deserialized single-ended form configuration data.

13. The method defined in claim 10 further comprising:
at the configuration device, serializing the configuration data and transmitting the serialized configuration data to the programmable logic device in differential signal form.

14. A method for loading configuration data into a programmable logic device having a plurality of configuration random-access-memory cells, the method comprising:
providing, from a host integrated circuit, a reference clock;
receiving the reference clock at the programmable logic device;
generating an internal clock from the reference clock;
receiving configuration data from a memory in parallel form;
serializing the parallel form configuration data;
transmitting, from the host integrated circuit, the serialized configuration data to the programmable logic device in differential signal form;
receiving the configuration data in differential signal form at the programmable logic device using the internal clock;
converting the configuration data from differential signal form to single-ended signal form; and
storing the configuration data in the plurality of configuration random-access-memory cells.

15. The method defined in claim 14 wherein the configuration data in differential signal form is received over a path, the method further comprising sending idle characters to the programmable logic device over the path.

16. The method defined in claim 15 further comprising systematically providing address data for the configuration data to the memory from the host integrated circuit.

* * * * *